US008922309B1

(12) United States Patent
Jing et al.

(10) Patent No.: US 8,922,309 B1
(45) Date of Patent: Dec. 30, 2014

(54) DEVICES AND METHODS FOR TUNING AN INDUCTOR (75) Inventors: Jing Jing, San Jose, CA (US); Shuxian Wu, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 8 days.

(21) Appl. No.: 13/274,894

(22) Filed: Oct. 17, 2011

(51) Int. Cl.
*H01F 30/14* (2006.01)
*H01F 21/08* (2006.01)
*H01F 21/02* (2006.01)

(52) U.S. Cl.
USPC ............. 336/10; 336/155; 336/146; 336/147

(58) Field of Classification Search
USPC ............. 336/10, 30, 155, 200, 223, 232, 40, 336/146, 147
See application file for complete search history.

(56) References Cited

U.S. PATENT DOCUMENTS

| 7,598,838 B2 * | 10/2009 | Hargrove et al. ............. 336/200 |
| 7,642,618 B2 * | 1/2010 | Shiramizu et al. ............ 257/531 |
| 7,999,386 B2 * | 8/2011 | Uchida et al. ................. 257/759 |
| 2002/0158711 A1 * | 10/2002 | Groves et al. ................. 333/174 |
| 2005/0068146 A1 * | 3/2005 | Jessie ............................. 336/200 |
| 2007/0182520 A1 * | 8/2007 | Kawakubo et al. ........... 336/200 |
| 2008/0055036 A1 * | 3/2008 | Jenkins et al. ................ 336/200 |
| 2010/0060403 A1 * | 3/2010 | Shyu et al. .................... 336/200 |
| 2011/0260819 A1 * | 10/2011 | Yeh et al. ...................... 336/155 |
| 2011/0291786 A1 * | 12/2011 | Li et al. ......................... 336/200 |

* cited by examiner

*Primary Examiner* — Mangtin Lian
(74) *Attorney, Agent, or Firm* — Gerald Chan; John J. King (57) ABSTRACT An inductive device includes an inductor having an inductance associated therewith, and a tuning ring disposed around the inductor. The tuning ring has an inductance associated therewith, wherein the tuning ring is coupled to the inductor to establish a mutual inductance between the tuning ring and the inductor. The inductance of the inductor, the inductance of the tuning ring, and the mutual inductance between the tuning ring and the inductor contribute to a total inductance of the inductive device. The tuning ring is configurable, and is selectively configured to achieve a certain value for the mutual inductance, and a certain value for the inductance of the tuning ring, without changing a footprint of the tuning ring.

19 Claims, 10 Drawing Sheets

DEVICES AND METHODS FOR TUNING AN INDUCTOR

TECHNICAL FIELD

Embodiments described herein relate to inductors, and in particular, to devices and methods for tuning inductors.

BACKGROUND

Tunable inductors are useful for fine-tuning/adjusting various circuit designs. One area where tunable inductors provide such benefits involves VCO (voltage controlled oscillator) circuit design, and in particular, advanced SerDes (serializer/deserializer) circuit designs. In such advanced SerDes circuit designs, inductance values are especially small and operating frequencies typically operate at frequencies of 10 GHz and above. Because of the nature of such circuit designs, accurate modeling of inductors becomes particularly challenging due to the unpredictable effects caused by the circuit environment (e.g., uncertainty in returning path formed from other circuit elements).

Whenever the operating frequency of the circuit falls outside of the desirable range, modifications must be made to the circuit in order to tune the circuit back within the desirable range. Such modifications typically involve modifying the design of particular circuit elements including inductors. Modifying the design of particular circuit elements results in changes to the circuit floorplan, which requires significant redesign of the entire circuit. Prior approaches have involved substituting circuit elements with alternative circuit elements in order to achieve such fine tuning. These approaches suffer from the requirement of significant circuit redesign and time-consuming layout changes.

SUMMARY

In accordance with some embodiments, an inductive device includes an inductor having an inductance associated therewith, and a tuning ring disposed around the inductor, the tuning ring having an inductance associated therewith. The tuning ring is coupled to the inductor to establish a mutual inductance between the tuning ring and the inductor. The inductance of the inductor, the inductance of the tuning ring, and the mutual inductance between the tuning ring and the inductor contribute to a total inductance of the inductive device. The tuning ring is configurable, and is selectively configured to achieve a certain value for the mutual inductance, and a certain value for the inductance of the tuning ring, without changing a footprint of the tuning ring.

In one or more embodiments, the tuning ring may include a plurality of metal stack layers and one or more vias, at least one of the metal stack layers being grounded, and the one or more vias may be selectively configured to connect to certain one or ones of the metal stack layers to thereby achieve the value for the mutual inductance.

In one or more embodiments, the value of the inductance of the tuning ring may increase, and the value of the mutual inductance may decrease, when a total number of the metal stack layers connected to the one or more vias is reduced, and the value of the inductance of the tuning ring may decrease, and the value of the mutual inductance may increase, when the total number of metal stack layers connected to the one or more vias is increased.

In one or more embodiments, the tuning ring may be selectively configurable during a manufacturing process of the tuning ring without changing the footprint of the tuning ring.

In one or more embodiments, the tuning ring may form a circular loop or a multi-sided loop around the inductor.

In one or more embodiments, the tuning ring may include a plurality of metal stack layers.

In one or more embodiments, the tuning ring may be selectively configurable during a manufacturing process of the tuning ring by changing a number of the metal stack layers without changing the footprint of the tuning ring.

In one or more embodiments, at least two of the metal stack layers may have different respective thicknesses.

In one or more embodiments, at least one of the metal stack layers may form a closed-loop.

In accordance with other embodiments, a configurable device for an inductor includes a plurality of metal stack layers disposed around the inductor. The metal stack layers are electrically connected by one or more vias, at least one of the metal stack layers being grounded. One or more of the metal stack layers are coupled to the inductor to establish a mutual inductance between the one or more of the metal stack layers and the inductor. The one or more vias are selectively configured to connect to certain one or ones of the metal stack layers to thereby achieve a certain value for the mutual inductance without changing a footprint of the metal stack layers.

In one or more embodiments, a value of the mutual inductance may decrease when a total number of the metal stack layers connected to the one or more vias is reduced, and the value of the mutual inductance may increase when the total number of metal stack layers connected to the one or more vias is increased.

In one or more embodiments, the one or more vias may be selectively configurable during a manufacturing process of a tuning ring that includes the metal stack layers without changing a footprint of the tuning ring.

In one or more embodiments, the plurality of metal stack layers may form a circular loop or a multi-sided loop around the inductor.

In one or more embodiments, the plurality of metal stack layers may include two metal stack layers.

In one or more embodiments, the one or more of the metal stack layers may include aluminum or copper.

In one or more embodiments, at least two of the metal stack layers may have different respective thicknesses.

In accordance with other embodiments, a method for configuring an inductive device includes determining a total inductance value to be achieved for the inductive device, the device having a tuning ring and an inductor, determining a configuration of the tuning ring using a processor for achieving the total inductance value for the inductive device without changing a footprint of the tuning ring, and storing information regarding the determined configuration in a non-transitory medium.

In one or more embodiments, the act of determining the configuration of the tuning ring may include determining a number of metal stack layers for the tuning ring.

In one or more embodiments, the act of determining the configuration of the tuning ring may include determining a configuration of one or more vias for connecting to one or more metal stack layers of the tuning ring.

In one or more embodiments, a self inductance of the tuning ring may increase and a value of a mutual inductance between the tuning ring and the inductor may decrease when a total number of the metal stack layers connected to the one or more vias is reduced, and the self inductance of the tuning ring may decrease and the value of the mutual inductance value may increase when the total number of the metal stack layers connected to the one or more vias is increased.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting of its scope.

FIG. 1-1 illustrates a top-view schematic diagram of a tunable ring around an inductor in accordance with some embodiments.

FIG. 1-2 illustrates a cross-sectional view schematic diagram of a tunable ring around an inductor in accordance with some embodiments.

FIG. 2-1 illustrates a tunable ring configuration in accordance with some embodiments.

FIG. 2-2 illustrates another tunable ring configuration in accordance with other embodiments.

FIG. 3-1 illustrates a tunable ring around an inductor in accordance with other embodiments.

FIG. 3-2 illustrates a tunable ring around an inductor in accordance with other embodiments.

FIG. 4-1 illustrates a tunable range of inductive values for a tunable ring around an inductor in accordance with some embodiments.

FIG. 4-2 illustrates a tunable range of Q-values for a tunable ring around an inductor in accordance with some embodiments.

DETAILED DESCRIPTION

Various embodiments are described hereinafter with reference to the figures. It should be noted that the figures are not drawn to scale and that the elements of similar structures or functions are represented by like reference numerals throughout the figures. It should be noted that the figures are only intended to facilitate the description of the embodiments. They are not intended as an exhaustive description of the invention or as a limitation on the scope of the invention. In addition, an illustrated embodiment need not have all the aspects or advantages shown. An aspect or an advantage described in conjunction with a particular embodiment is not necessarily limited to that embodiment and can be practiced in any other embodiments even if not so illustrated. Also, reference throughout this specification to "some embodiments" or "other embodiments" means that a particular feature, structure, material, or characteristic described in connection with the embodiments is included in at least one embodiment. Thus, the appearances of the phrase "in some embodiments" or "in other embodiments" in various places throughout this specification are not necessarily referring to the same embodiment or embodiments.

Figure 11:
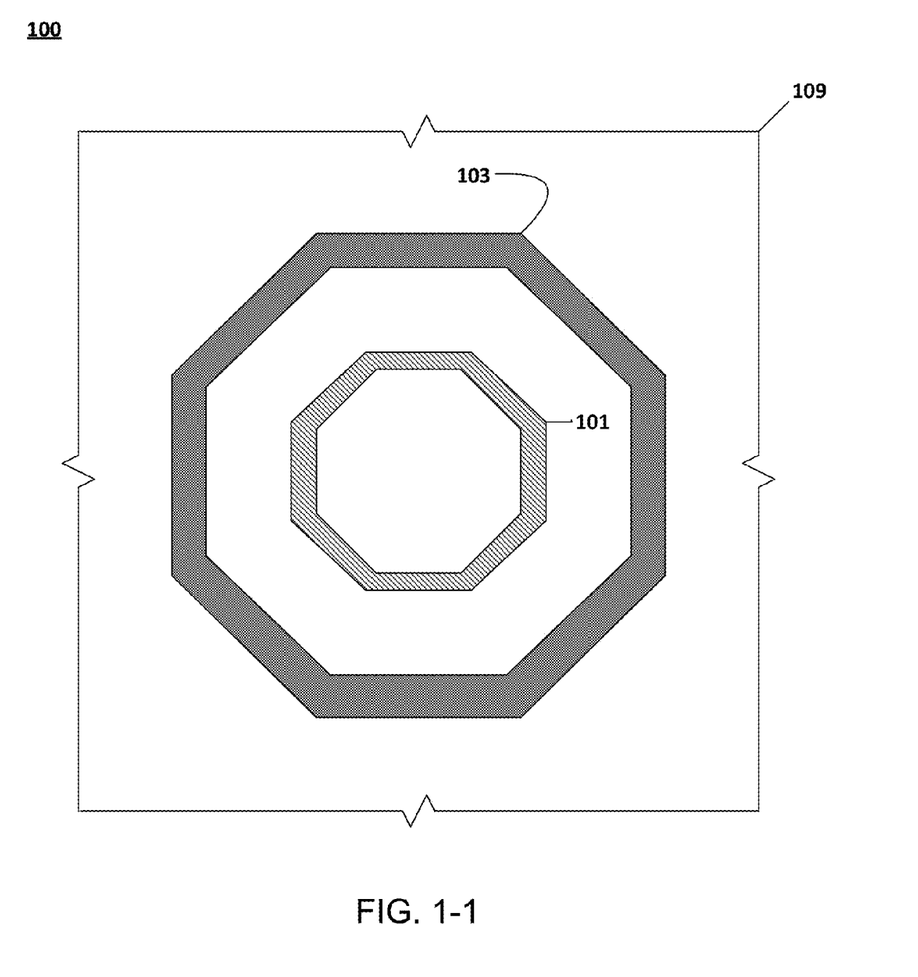
Figure 12:
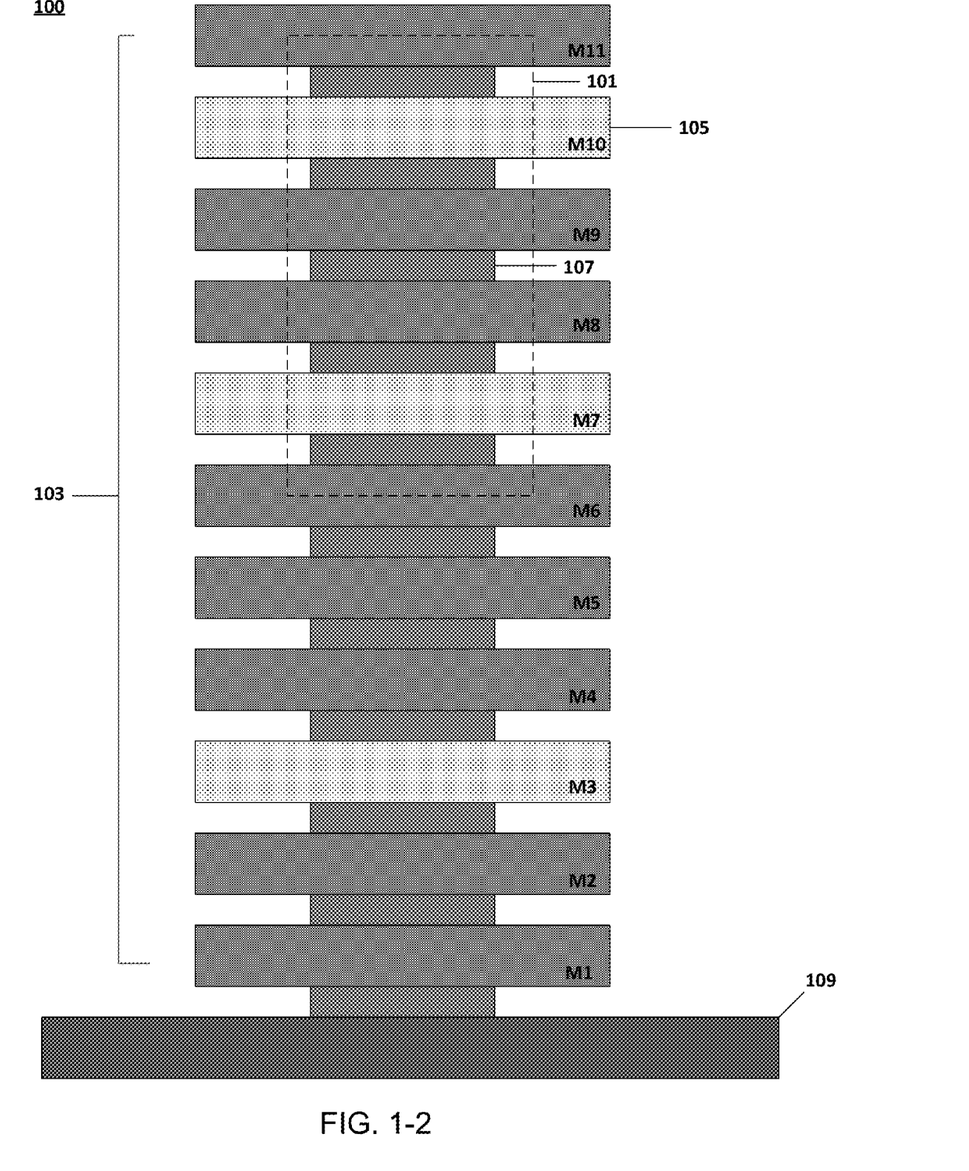

FIGS. 1-1 and 1-2 illustrate an inductive device 100 having an inductor 101 and a tuning ring 103 around the inductor 101 according to some embodiments. FIG. 1-1 and FIG. 1-2 are to be viewed together, where FIG. 1A illustrates a top-view schematic diagram of the tuning ring 103 around the inductor 101, and where FIG. 1-2 illustrates a cross-sectional view schematic diagram of the tuning ring 103 around the inductor 101. The inductive device 100 is connected to a substrate 109. In some embodiments, the substrate 109 may be a part of a circuit device. Also, in some embodiments, the circuit device may include a configurable integrated circuit, such as a field programmable gate array ("FPGA"), or another type of programmable logic device ("PLD"). In other embodiments, the substrate 109 may be a part of any circuit device, and may or may not include any programmable logic device.

In FIG. 1-2, the inductor 101 is depicted as a dashed rectangle in order to illustrate that the inductor 101 is surrounded by the tuning ring 103. The tuning ring 103 is inductively coupled to the inductor 101 such that a mutual inductance is established between the tuning ring 103 and the inductor 101. A total inductance value of the tunable inductive device 100 comprises the mutual inductance between the tuning ring 103 and the inductor 101, as well as the inductance (self-inductance) of the inductor 101, and the inductance (self-inductance) of the tuning ring 103. In the illustrated embodiments, the inductor 101 is built from upper metal layers (M6-M11). In other embodiments, the inductor 101 may be built from layers that are different from those shown. For example, in other embodiments, the inductor 101 may be built from layers M5-M11, or from layers M5-M10, etc.

As shown in FIG. 1-2, the tuning ring 103 may include a plurality of metal stack layers 105 which are selectively connectable to one or more vias 107. In the illustrated embodiments, the tuning ring 103 has eleven metal stack layers 105 (layers M1-M11). In other embodiments, the tuning ring 103 may have less than eleven metal stack layers 105 (e.g., one metal stack layer), or more than eleven metal stack layers 105. In some embodiments, the metal stack layers 105 may be composed of different materials, such as aluminum or copper. For example, in the embodiments of FIG. 1-2, metal stack layers M1, M2, M4, M5, M6, M8, M9, and M11 may be composed of aluminum, and metal stack layers M3, M7, and M10 may be composed of copper. In other embodiments, the metal stack layers M1, M2, M4, M5, M6, M8, M9, and M11 may be made from copper or another material, and/or the metal stack layers M3, M7, and M10 may be made from aluminum or another material. Also, in other embodiments, the metal stack layers 105 may be made from more than two materials (e.g., three different materials, or more). In further embodiments, the metal stack layers 105 may be all made from a same material.

Figure 5:
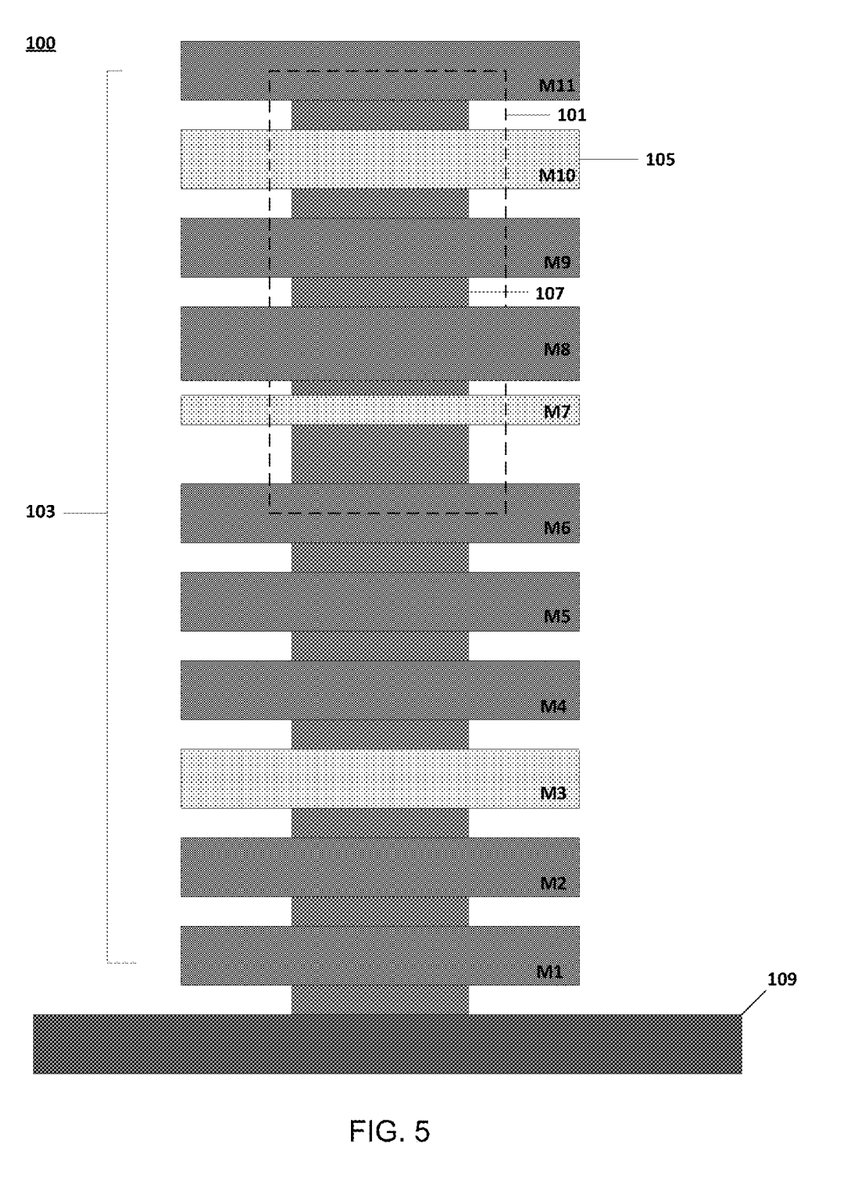
FIG. 5 illustrates a tuning ring having metal stack layers with different respective thickness, in accordance with some embodiments.

In the illustrated embodiments, the metal stack layers 105 all have the same thickness measured in a direction that is along a longitudinal axis of the tuning ring 103. In other embodiments, the metal stack layers 105 may vary in thickness. For example, in other embodiments, at least two (e.g., all) of the metal stack layers 105 may have different respective thicknesses. In further embodiments, the tuning ring 103 may have metal stack layers 105 with different respective material compositions, and with different respective thicknesses. An example of a tuning ring 103 having metal stack layers 105 with different respective thickness is illustrated in FIG. 5, where metal stack layer M8 and metal stack layer M9 have different respective thicknesses than the other metal stack layers.

In some embodiments, each via 107 between two metal stack layers 105 may have a ring configuration. In such cases, the ring configuration may correspond with a cross sectional profile of the metal stack layers 105. In other embodiments, the tuning ring 103 may include a plurality of vias 107 connected between each pair of metal stack layers 105. Although a gap is shown between two adjacent metal stack layers 105, in other embodiments, the tuning ring 103 may include an electrically insulative layer coupled between adjacent metal stack layers 105.

In some embodiments, each of the metal stack layers 105 may form a closed-loop around the inductor 101. In other embodiments, a plurality, but not all, of the metal stack layers 105 may each form a closed-loop around the inductor 101. In further embodiments, only one of the metal stack layers 105 forms a closed loop around the inductor 101. Thus, in some embodiments, one or more of the metal stack layers 105 may not form a closed-loop. Also, in some embodiments, at least one of the metal stack layers 105 is grounded (e.g., connected to the substrate 109) to form a returning path.

In the illustrated embodiments, the configuration of the tuning ring 103 is selectively modifiable to achieve a certain value for the self inductance of the tuning ring 103, and/or a certain value for the mutual inductance between the tuning ring 103 and the inductor 101, without changing a footprint of the tuning ring 103. For example, in some embodiments, changing the configuration of the tuning ring 103 may result in a corresponding change in the self-inductance of the tuning ring 103, as well as a corresponding change in the mutual inductance between the tuning ring 103 and the inductor 101. Since the total inductance of the inductive device 101 is contributed at least in part by the mutual inductance provided by the tuning ring 103, and at least in part by the self inductance of the tuning ring 103, the total inductance of the inductive device 101 may be adjusted ("tuned") by modifying the tuning ring 103 without changing its footprint or the floorplan layout of its corresponding circuit (not shown). As used herein, the term "footprint" refers to a component's layout with respect to its corresponding circuit. A tuning ring 103 may be considered to retain its "footprint", when it is modified such that the other circuit elements of the corresponding circuit are able to remain unchanged (e.g., no need for layout redesign). Said otherwise, the tuning ring 103 may be modified to achieve a desired mutual inductance between the tuning ring 103 and the inductor 101 without requiring any other circuit elements to be modified, including the inductor 101 itself.

In some embodiments, the configuration of the tuning ring 103 may be modified by altering a configuration (e.g., location and/or number) of the via(s) 107 so that certain one or ones of the metal stack layers 105 are connected to the via(s) 107. For example, one via 107 may be selectively removed to disconnect certain one(s) of the metal stack layers 105 from the rest, or may be selectively added to connect certain one(s) of the metal stack layers 105 to the rest.

Figure 21:
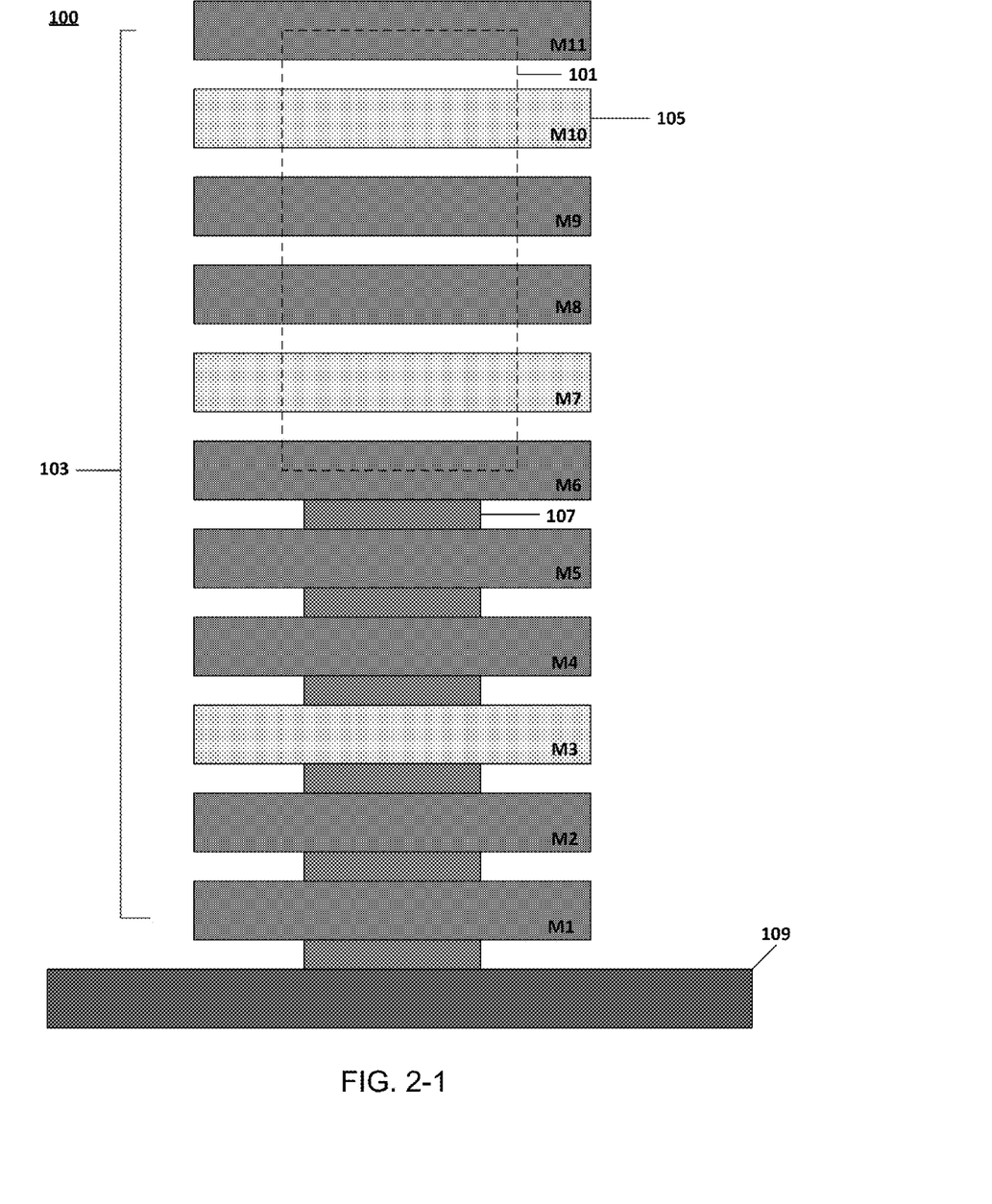

For example, while the tuning ring 103 in the embodiments of FIG. 1-2 has been configured so that the via(s) 107 connects to all of the eleven metal stack layers 105, in other embodiments, the via(s) 107 may be configured differently so that it connects to a subset of the metal stack layers 105. FIG. 2-1 illustrates an example of another configuration of the tuning ring 103. The tuning ring 103 is the same as that described with reference to FIG. 1-2 (e.g., it has the same eleven metal stack layers M1-M11), except that the via(s) 107 has been configured so that only certain ones of the metal stack layers 105 are connected. In the illustrated example, the metal stack layers 105 are not all electrically connected by via(s) 107. In this embodiment, metal stack layers M1-M6 are connected by via(s) 107, and metal stack layers M7-M11 are not connected by via(s) 107. By selectively configuring certain one(s) of the metal stack layers 105 to be connected to the via(s) 107, the tuning ring 103 is able to achieve a desired mutual inductance value with the inductor 101.

Figure 22:
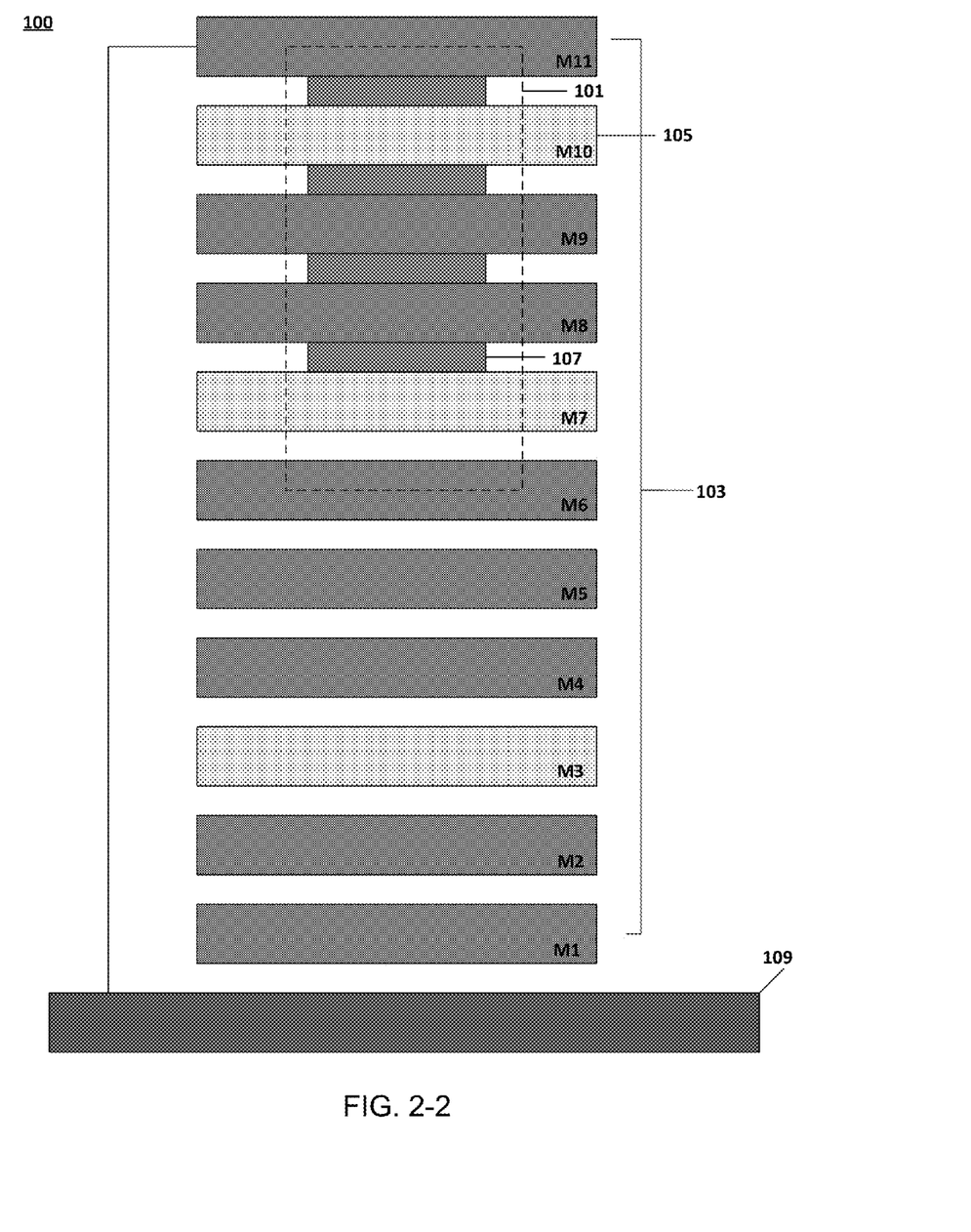

FIG. 2-2 illustrates another configuration of the tuning ring 103 in which the via(s) 107 has been configured to connect certain ones of the eleven metal stack layers 105. In the illustrated example, the metal stack layers 105 are again not all electrically connected by via(s) 107. However in this embodiment, the subset of the metal stack layers 105 which are connected by via(s) 107 are not connected to the ground (e.g., substrate 109). As such, an additional electrical connection is formed between at least one of the metal stack layers 105 within the subset and the ground (e.g., substrate 109) in order to ensure proper operation of the tuning ring 103. By selectively altering the number of the metal stack layers 105 that are connected to the via(s) 107, the tuning ring 103 is able to achieve a certain desired mutual inductance value with the inductor 101, and/or a certain desired self-inductance for the tuning ring 103.

As illustrated in the above examples, since changing the configuration of the via(s) 107 does not affect the area occupied by the tuning ring 103 relative to the substrate 109, such technique of changing the configuration of the tuning ring 103 to tune the inductive device 100 does not change the footprint of the tuning ring 103. It also does not require any modification of the floorplan layout of any corresponding components on the substrate 109 in some embodiments.

In other embodiments, instead of changing the configuration of the via(s) 107, the configuration of the metal stack layers 105 may be modified to configure the tuning ring 103. For example, in some embodiments, the tuning ring 103 may be selectively configured by altering a number of the metal stack layer(s) 105 for the tuning ring 103. In some embodiments, the tuning ring 103 may be selectively built to have only one stack layer 105. In other embodiments, the tuning ring 103 may be selectively built to have other numbers of metal stack layers 105. Since changing the number of metal stack layer(s) 105 affects the height of the tuning ring 103, and not the area occupied by the tuning ring 103 relative to the substrate 109, such technique of changing the configuration of the tuning ring 103 to tune the inductive device 100 does not change the footprint of the tuning ring 103. It also does not require any modification of the floorplan layout of any corresponding components on the substrate 109 in some embodiments.

In other embodiments, the configuration of the metal stack layers 105 may be modified by changing a thickness of one or more metal stack layers 105. In further embodiments, the configuration of the metal stack layers 105 may be modified by changing a material composition of one or more of the metal stack layers 105.

In further embodiments, the configuration of the tuning ring 103 may be modified by both altering a configuration of the via(s) 107 and a configuration (e.g., number, dimension, composition, etc.) of the metal stack layer(s) 105 for the tuning ring 103. Such technique of changing the configuration of the tuning ring 103 to tune the inductive device 100 does not change the footprint of the tuning ring 103. It also does not require any modification of the floorplan layout of any corresponding components on the substrate 109 in some embodiments.

As discussed, the self inductance of the tuning ring 103 and the mutual inductance between the tuning ring 103 and the inductor 101 may be varied by changing the number of metal stack layers 105 within the tuning ring 103 and/or the configuration of the via(s) 107 within the tuning ring 103. A tuning ring 103 with a smaller number of connected metal stack layers 105 (e.g., one metal stack layer 105) will result in higher self inductance of the tuning ring 103 and a lower mutual inductance between the tuning ring 103 and the inductor 101. A tuning ring 103 with a greater number of connected metal stack layers 105 will result in lower self inductance of the tuning ring 103 and a higher mutual inductance between the tuning ring 103 and the inductor 101. By selectively configuring the number of metal stack layer(s) 105 that the tuning ring 103 has, and/or by selectively configuring the via(s) 107 to connect certain one(s) of the metal stack layers 105, the self inductance of the tuning ring 103 and the mutual inductance between the tuning ring 103 and the inductor 101 may be adjusted, thereby resulting in a desired total inductance (which is at least partially contributed by the mutual inductance between the tuning ring 103 and the inductor 101, and by the self inductance of the tuning ring 103) for the inductive device 100. Thus, providing multiple configurations for the metal stack layers 105, and/or multiple configurations for the via(s) 107, is advantageous in that the tuning ring 103 may be selectively configured to provide a wide range of mutual inductance values that are achievable between the tuning ring 103 and the inductor 101, thereby allowing a desired total inductance for the inductive device 101 to be achieved.

In some embodiments, the configuration of the tuning ring 103 may be modified during a fabrication process (which may be considered a part of a manufacturing process) of the tuning ring 103. In one implementation, the modification of the configuration of the tuning ring 103 may be achieved by modifying a set of masks applied to fabricate the tuning ring 103. For example, adding or removing masks during the fabrication process may result in different tuning rings 103 with varying metal stack layers 105 and/or different configuration for the via(s) 107. Thus, various configurations for the one or more metal stack layers 105 and/or one or more vias 107 are achievable during the fabrication process to provide different mutual inductance values between the tuning ring 103 and the inductor 101, and/or different self-inductance values for the tuning ring 103. In such cases, the act of configuring the tuning ring 103 may be considered performed during the fabrication process of the tuning ring 103.

While the modification of the tuning ring 103 design may involve re-patterning the application of mask(s) used to fabricate the tuning ring 103, the footprint of the tuning ring 103 remains unchanged. As such, the remaining circuit elements are negligibly affected or completely unaffected, and the inductance of the inductive device 100 may be "tuned" to achieve a desired value while retaining the original circuit layout and original circuit elements. Thus, embodiments of the inductive device 100 described herein, and embodiments of the technique to configure the inductive device 100, are advantageous in that they saves cost and time that would otherwise be required to change the floorplan layout to redesign the circuit.

In other embodiments, the configuration of the tuning ring 103 may be modified during a design phase (which may be considered another part of a manufacturing process) of the tuning ring 103. For example, during a design of the tuning ring 103, the configuration of the tuning ring 103 may be modified using any of the techniques described herein (e.g., by changing the configuration of metal stack layers 105, and/or the configuration of the via(s) 107). In such cases, the act of configuring the tuning ring 103 may be considered performed when the design of the tuning ring 103 is modified to change the configuration of the metal stack layers 105 and/or the via(s) 107. Thus, the term "tuning ring" may refer to the actual tuning ring 103, or a design version of the tuning ring 103. Similarly, the terms "inductive device", "inductor", "stack metal layer", "via" (or similar terms) may refer to the actual inductive device, the actual inductor, the actual stack metal layer, and the actual via, respectively, or may refer to design version of the inductive device, design version of the inductor, design version of the stack metal layer, and design version of the via, respectively.

Figure 6:
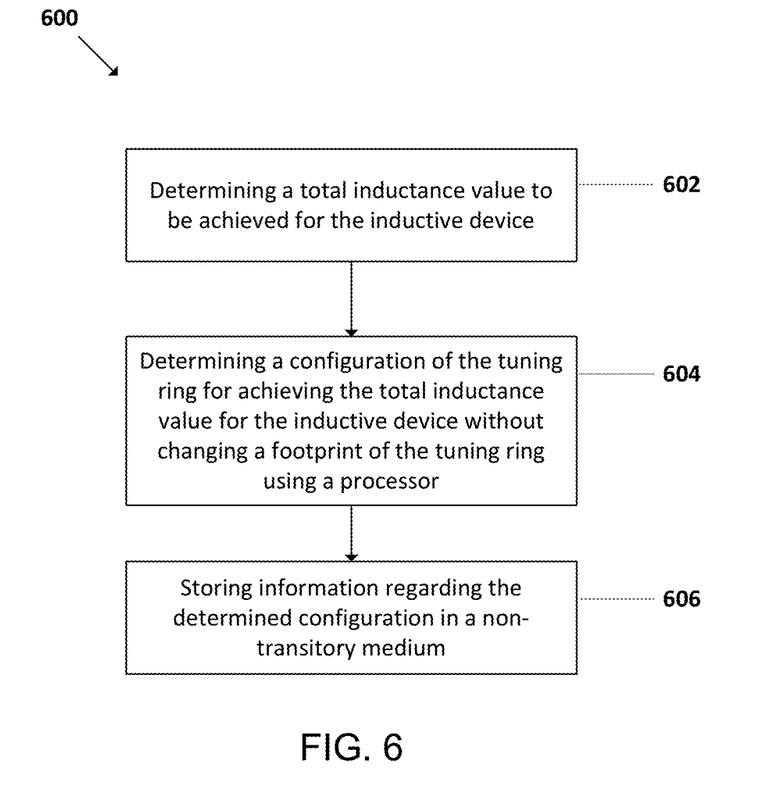
FIG. 6 is a flow diagram for a method of configuring an inductive device, in accordance with some embodiments.

In some embodiments, a method for configuring the inductive device 100 may include determining a total inductance value to be achieved for the inductive device 100 (602), determining a configuration of the tuning ring 103 for achieving the total inductance value for the inductive device without changing a footprint of the tuning ring 103 (604), and storing information regarding the determined configuration in a non-transitory medium (606). A flow diagram depicting this method 600 is shown in FIG. 6. The method may be performed during a design phase of the tuning ring 103 in some embodiments. In some embodiments, the stored information may be used to create one or more masks for constructing the tuning ring 103. For example, the mask(s) may be used to configure the via(s) 107 to connect to certain one(s) of the metal stack layers 105 in some embodiments.

In some embodiments, the act of determining the total inductance value to be achieved may be performed by a processor. For example, in some embodiments, the processor may receive the total inductance value as input from a user or from another device.

In some embodiments, the act of determining the configuration of the tuning ring 103 for achieving the total inductance value may be performed by the processor (or another processor). For example, in some embodiments, the processor may receive information regarding the configuration of the tuning ring 103 for achieving the total inductance value for the inductive device 100 from a user or from another device. In other embodiments, the processor may perform calculation to determine the configuration of the tuning ring 103 based on the desired total inductance value to be achieved for the inductive device 100, and based on certain design parameters (e.g., shape, dimension(s), material property, location, footprint, etc.) of the components (e.g., metal stack layer(s), via(s)) of the tuning ring 103. For example, in some embodiments, the processor may obtain an inductance value of an inductor 101, and may then compare the inductance value with a desired total inductance value that is to be achieved by the inductive device 100. In one implementation, the processor may calculate a difference between the inductance value of an inductor 101 and the desired total inductance value, and determine a configuration for the tuning ring 103 so that the self inductance of the tuning ring 103 and the mutual inductance between the tuning ring 103 and the inductor 101 can make up for the calculated difference. In some embodiments, the processor may calculate the mutual inductance value between the tuning ring 103 and the inductor 101 based on the configuration of the inductor 101 and the configuration of the tuning ring 103. The processor may also calculate the self-inductance value of the tuning ring 103 based on the configuration of the tuning ring 103.

In some embodiments, the act of determining the configuration of the tuning ring 103 may include determining a number of metal stack layers 105 for the tuning ring 103, and/or selecting certain one(s) of the metal stack layers 105 for connection by the via(s) 107. In other embodiments, the act of determining the configuration of the tuning ring 103 may include determining a configuration of one or more vias 107 for connecting to one or more metal stack layers 105 of the tuning ring 103. As discussed, in some embodiments, the mutual inductance value may decrease when a total number of the metal stack layers 105 connected to the one or more vias 107 is reduced, and the mutual inductance value may increase when the total number of the metal stack layers 105 connected to the one or more vias 107 is increased.

Figure 31:
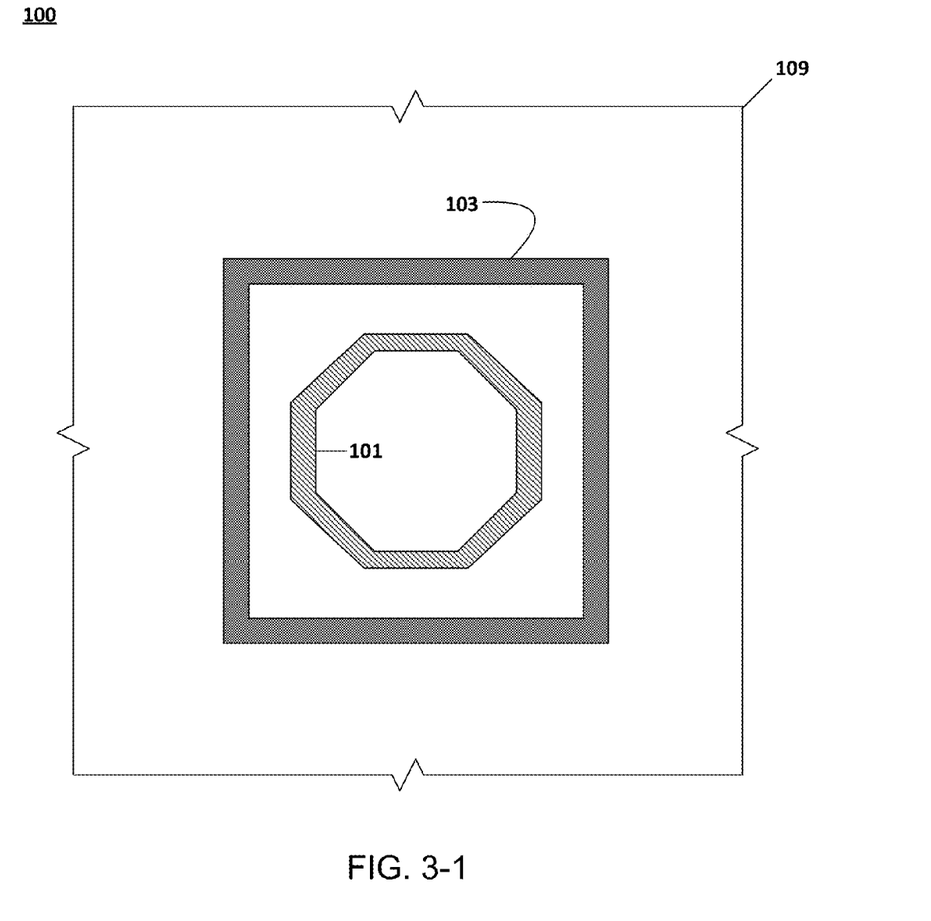
Figure 32:
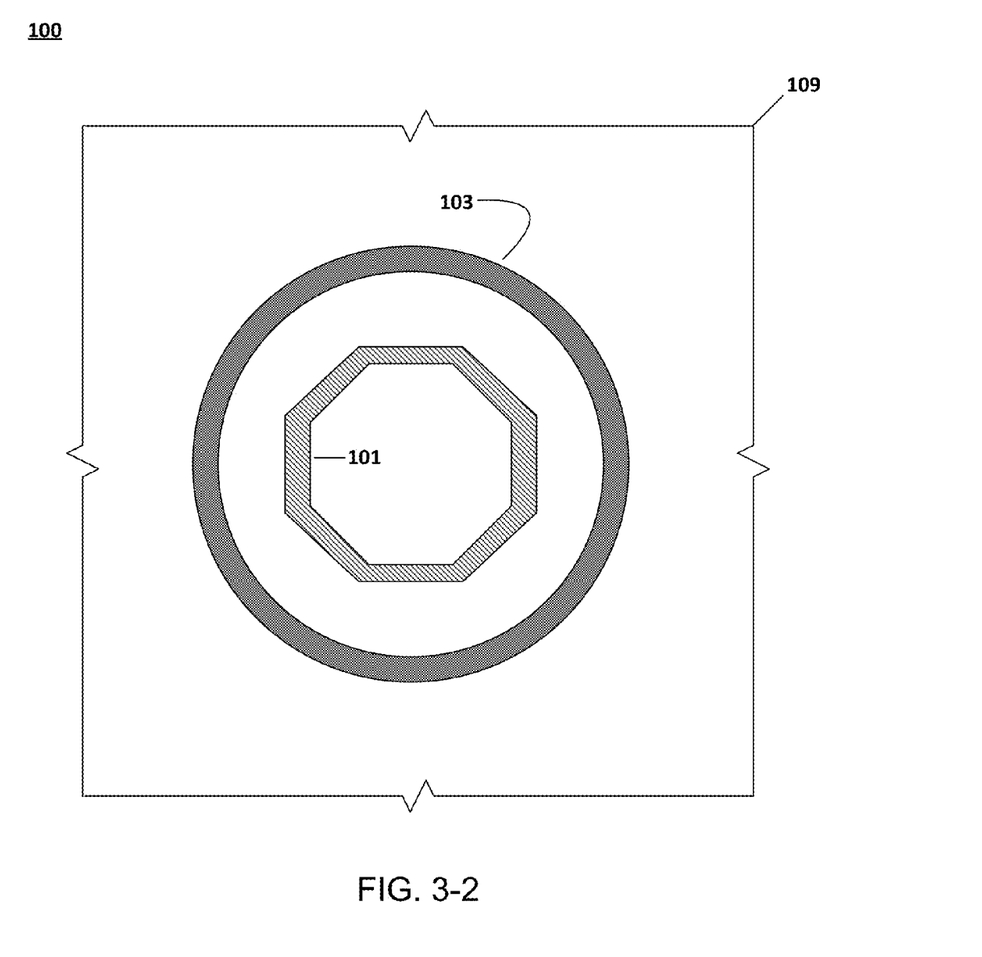

It should be noted that the cross sectional shape of the tuning ring 103 is not limited to the example illustrated previously, and that the tuning ring 103 may have different cross sectional shapes in other embodiments. FIG. 3-1 is a top-view schematic diagram of an inductive device 100 comprising a tuning ring 103 surrounding an inductor 101 according to some further embodiment. In FIG. 3-1, the tuning ring 103 forms a rectangular loop around the inductor 101. FIG. 3-2 is a top-view schematic diagram of an inductive device 100 comprising a tuning ring 103 surrounding an inductor 101 according to other embodiments. In FIG. 3-2, the tuning ring 103 forms a circular loop around the inductor 101. In further embodiments, the cross sectional shape of the tuning ring 103 may have other configurations. For example, in other embodiments, the cross section of the tuning ring 103 may have a triangular shape, an pentagon shape, or any of other multi-sided polygonal shapes. In still further embodiments, the cross sectional shape of the tuning ring 103 may have a customized shape (such as an irregular shape).

Figure 41:
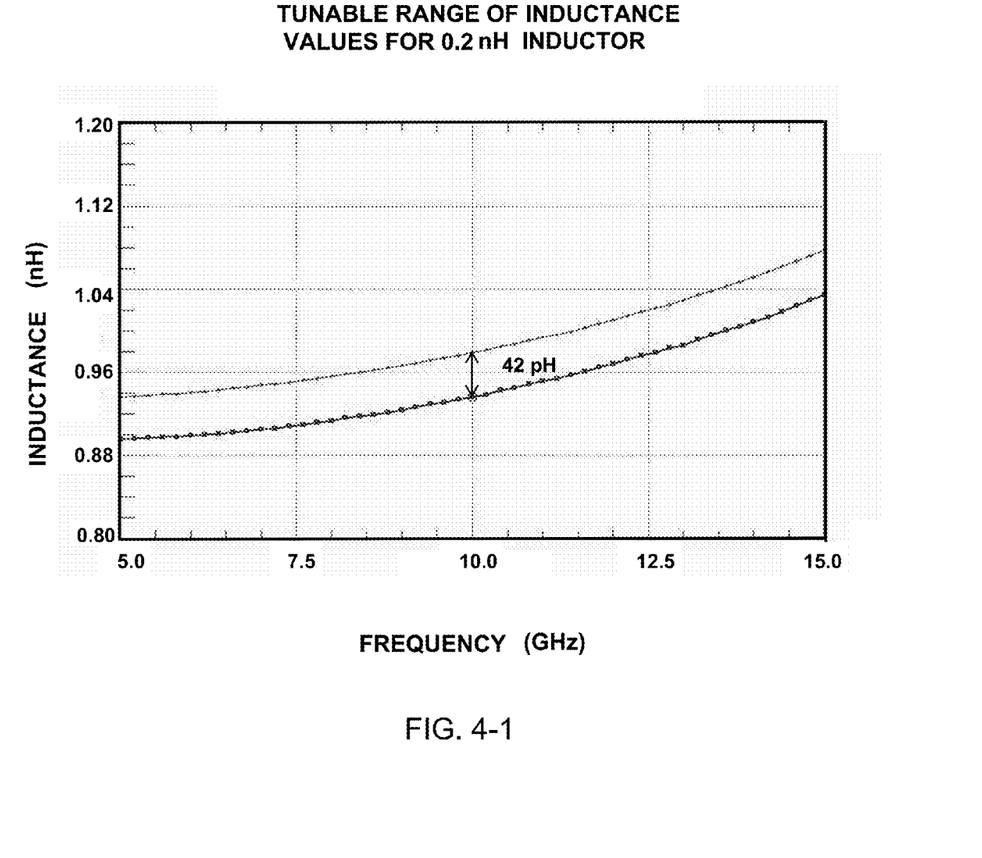
Figure 42:
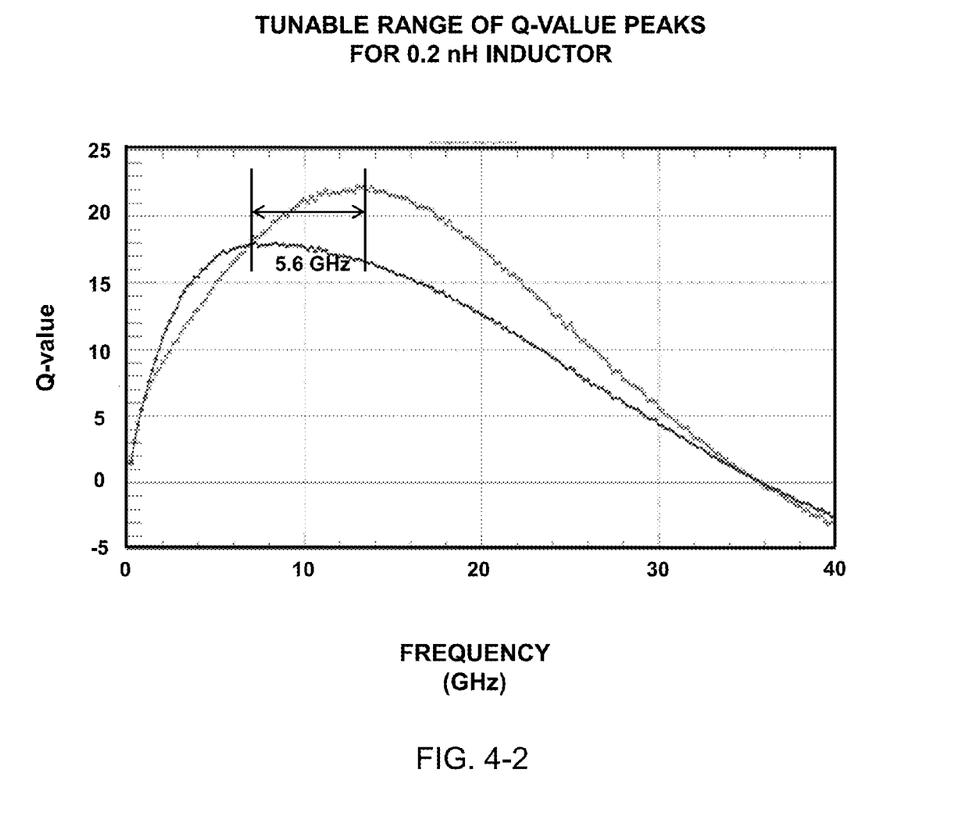

As discussed above, modifying the configuration of the tuning ring 103 (e.g., number of metal stack layers and/or number of vias) may allow for tuning the inductance of an inductive device 100. Additionally, modifying the configuration of the tuning ring 103 may also allow for tuning of a Q-value peak associated with the inductive device 100. Q-value is a dimensionless parameter that describes how underdamped an oscillator is. A higher Q-value peak indicates a lower rate of energy loss relative to the stored energy of the oscillator. In some embodiments, to improve circuit performance, it may be desirable to optimize inductor Q peak frequency to be the same as the circuit operating frequency. FIGS. 4-1 and 4-2 illustrate exemplary tunable ranges of inductive values and Q-value peaks, respectively, for various tuning ring configurations.

FIG. 4-1 is a graph illustrating a tunable range of inductive values for a particular tuning ring 103 around an inductor 101 in accordance with some embodiments. The graph represents inductive values for various operating frequencies of an inductive device 100 for two different achievable configurations of the tuning ring 103. In this example, the inductor 101 has an inductance value of 0.9 nH. The top line in FIG. 4-1 illustrates inductive values generated by a first tuning ring configuration having a single metal stack layer 105 connected to the via(s) 107. The bottom line in FIG. 4-1 illustrates inductive values generated by a second tuning ring configuration having eleven metal stack layers all connected by via(s) 107. The tunable range of inductive values is 42 pH in the illustrated embodiments. This provides a significant tuning range for small inductors, e.g., inductors below 0.4 nH. In other embodiments, the tunable range may have other values. Also, in some embodiments, for a 0.2 nH inductor, the above configuration offers a 21% tuning range. In other embodiments, the tuning range may have other percentages.

In addition to tuning inductance values for a circuit, the tuning ring 103 may also be configured to tune Q-values associated with a particular inductive device 101. FIG. 4-2 is a graph illustrating a tunable range of Q-value peaks for a particular tuning ring 103 around an inductor 101. The graph represents Q-values for various operating frequencies of an inductive device 100 for two different configurations of the tuning ring 103. Like the examples described with respect to FIG. 4-1, the inductor 101 has an inductance value of 0.9 nH. The top line in FIG. 4-2 illustrates Q-values generated by a first tuning ring configuration having a single metal stack layer 105 connected to the via(s) 107. The bottom line in FIG. 4-2 illustrates Q-values generated by a second tuning ring configuration having eleven metal stack layers 105 all connected by the via(s) 107. In this particular example, the Q-value peak has a range of 5.6 GHz for the tuning ring 103. This provides a wide tuning widow for the inductor's operating frequency.

FIGS. 4-1 and 4-2 merely illustrate some examples of a tunable range of inductive values and Q-value peaks. Other tunable ranges may be attained by varying the inductive value of the inductor 101 and/or the configuration of the tuning ring 103. In particular, while the above examples illustrate a tunable range of inductive values and a tunable range of Q-value peaks for a particular inductor 101 and particular tuning rings 103, it is important to note that a variety of tunable ranges may be achieved for numerous different inductors 101 using different configurations of the tuning ring 103.

Although particular embodiments have been shown and described, it will be understood that they are not intended to limit the claimed invention, and it will be made obvious to those skilled in the art that various changes and modifications may be made without departing from the spirit and scope of the claimed invention. The specification and drawings are, accordingly, to be regarded in an illustrative rather than restrictive sense. The claimed invention is intended to cover alternatives, modifications, and equivalents.

What is claimed is:

1. An inductive device, comprising:
an inductor implemented in a first plurality of metal layers of a number of metal layers extending from a substrate to a top metal layer, the inductor having an inductance associated therewith; and
a tuning ring comprising a plurality of metal stack layers implemented in a second plurality of metal layers of the number of metal layers extending from the substrate to the top metal layer, wherein the tuning ring surrounds the inductor and has an inductance associated therewith;
wherein the tuning ring is coupled to the inductor to establish a mutual inductance between the tuning ring and the inductor;
wherein the inductance of the inductor, the inductance of the tuning ring, and the mutual inductance between the tuning ring and the inductor contribute to a total inductance of the inductive device; and
wherein the tuning ring is configurable, and is selectively configured with a smaller number of connected metal stack layers than the second plurality of metal layers of the number of metal layers to achieve a certain value for the mutual inductance, and a certain value for the inductance of the tuning ring, without changing a footprint of the tuning ring.

2. The inductive device of claim 1, wherein:
the tuning ring further comprises one or more vias, at least one of the metal stack layers being grounded; and
the one or more vias are selectively configured to connect to certain one or ones of the metal stack layers to thereby achieve the value for the mutual inductance.

3. The inductive device of claim 2, wherein:
the value of the inductance of the tuning ring increases, and the value of the mutual inductance decreases, when a total number of the metal stack layers connected to the one or more vias is reduced; and
the value of the inductance of the tuning ring decreases, and the value of the mutual inductance increases, when the total number of metal stack layers connected to the one or more vias is increased.

4. The inductive device of claim 1, wherein the tuning ring is selectively configurable during a manufacturing process of the tuning ring without changing the footprint of the tuning ring.

5. The inductive device of claim 1, wherein the tuning ring forms a circular loop or a multi-sided loop around the inductor.

6. The inductive device of claim 1, wherein the tuning ring is selectively configurable during a manufacturing process of the tuning ring by selecting the second plurality of the metal layers without changing the footprint of the tuning ring.

7. The inductive device of claim 1, wherein at least two of the metal stack layers have different respective thicknesses.

8. The inductive device of claim 1, wherein at least one of the metal stack layers forms a closed-loop.

9. A configurable device for an inductor, comprising:
an inductor implemented in a first plurality of metal layers of a number of metal layers extending from a substrate to a top metal layer, the inductor having an inductance associated therewith;
a plurality of metal stack layers implemented in a second plurality of metal layers of the number of metal layers extending from the substrate to the top metal layer and surrounding the inductor, wherein the metal stack layers are electrically connected by one or more vias, at least one of the metal stack layers being grounded;
wherein a smaller number of metal stack layers than the second plurality of metal layers of the numbers of metal layers are coupled to the inductor to establish a mutual inductance between the smaller number of metal stack layers and the inductor; and
wherein the one or more vias are selectively configured to connect to certain one or ones of the metal stack layers to thereby achieve a certain value for the mutual inductance without changing a footprint of the metal stack layers.

10. The configurable device of claim 9, wherein:
a value of the mutual inductance decreases when a total number of the metal stack layers connected to the one or more vias is reduced; and
the value of the mutual inductance increases when the total number of metal stack layers connected to the one or more vias is increased.

11. The configurable device of claim 9, wherein the one or more vias are selectively configurable during a manufacturing process of a tuning ring that includes the metal stack layers without changing a footprint of the tuning ring.

12. The configurable device of claim 9, wherein the plurality of metal stack layers forms a circular loop or a multi-sided loop around the inductor.

13. The configurable device of claim 9, wherein the plurality of metal stack layers comprises two metal stack layers.

14. The configurable device of claim 9, wherein the one or more of the metal stack layers comprise aluminum or copper.

15. The configurable device of claim 9, wherein at least two of the metal stack layers have different respective thicknesses.

16. A method for configuring an inductive device, comprising:
determining a total inductance value to be achieved for the inductive device, the inductive device having an inductor implemented in a first plurality of metal layers of a number of metal layers extending from a substrate to a top metal layer, and a tuning ring comprising a plurality of metal stack layers implemented in a second plurality of metal layers of the number of metal layers extending from the substrate to the top metal stack layer and surrounding the inductor;
determining a configuration of the tuning ring using a processor for achieving the total inductance value for the inductive device without changing a footprint of the tuning ring, wherein the tuning ring includes a smaller number of connected metal stack layers than the second plurality of metal layers of the number of metal layers; and
storing information regarding the determined configuration in a non-transitory medium.

17. The method of claim 16, wherein an act of determining the configuration of the tuning ring comprises determining the smaller number of the connected metal stack layers for the tuning ring.

18. The method of claim 16, wherein an act of determining the configuration of the tuning ring comprises determining a configuration of one or more vias for connecting to one or more of the metal stack layers of the tuning ring.

19. The method of claim 18, wherein:
a self inductance of the tuning ring increases and a value of a mutual inductance between the tuning ring and the inductor decreases when a total number of the metal stack layers connected to the one or more vias is reduced; and
the self inductance of the tuning ring decreases and the value of the mutual inductance value increases when the total number of the metal stack layers connected to the one or more vias is increased.

\* \* \* \* \*